US008088502B2

(12) United States Patent
Martin et al.

(10) Patent No.: US 8,088,502 B2
(45) Date of Patent: Jan. 3, 2012

(54) NANOSTRUCTURED THIN FILM OPTICAL COATINGS

(75) Inventors: Peter M. Martin, Kennewick, WA (US); Charles H. Henager, Jr., Kennewick, WA (US); Wendy D. Bennett, Kennewick, WA (US); Ralph E. Williford, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 1139 days.

(21) Appl. No.: 11/858,249

(22) Filed: Sep. 20, 2007

(65) Prior Publication Data
US 2008/0070034 A1 Mar. 20, 2008

Related U.S. Application Data

(60) Provisional application No. 60/846,374, filed on Sep. 20, 2006.

(51) Int. Cl.
*B32B 9/00* (2006.01)

(52) U.S. Cl. ......... 428/701; 428/698; 428/702; 428/704

(58) Field of Classification Search .................. 428/701, 428/702, 704, 216, 336, 407
See application file for complete search history.

(56) References Cited

U.S. PATENT DOCUMENTS

| 4,266,223 A | 5/1981 | Frame |
| 4,521,458 A | 6/1985 | Nelson |
| 4,555,274 A | 11/1985 | Kitajima et al. |
| 4,557,978 A | 12/1985 | Mason |
| 4,722,515 A | 2/1988 | Ham |
| 4,768,666 A | 9/1988 | Kessler |
| 5,036,249 A | 7/1991 | Pike-Biegunski et al. |
| 5,059,861 A | 10/1991 | Littman et al. |
| 5,124,204 A | 6/1992 | Yamashita et al. |
| 5,189,405 A | 2/1993 | Yamashita et al. |
| 5,203,898 A | 4/1993 | Carpenter et al. |
| 5,204,314 A | 4/1993 | Kirlin et al. |
| 5,393,607 A | 2/1995 | Kawasaki et al. |
| 5,402,314 A | 3/1995 | Amago et al. |
| 5,461,545 A | 10/1995 | Leroy et al. |
| 5,652,192 A | 7/1997 | Matson et al. |

(Continued)

FOREIGN PATENT DOCUMENTS

EP 0 777 280 A2 4/1997

(Continued)

OTHER PUBLICATIONS

Bunshah, R.F., et al., "Deposition Technologies for Films and Coatings" Noyes Publications, Park Ridge, New Jersey, 1982, p. 339.

(Continued)

*Primary Examiner* — Timothy Speer
(74) *Attorney, Agent, or Firm* — Derek H. Maughan

(57) ABSTRACT

A durable coating made up of superimposed microlayers of preselected materials, and a method of making and utilizing such a coating. In one embodiment of the invention, at least 200 microlayers of at least one transparent material, having a thickness of less than 50 nms are superimposed in a sequential manner so as to obtain a desired arrangement between the layers. This structure then forms a transparent coating that has strength characteristics that are substantially greater than the strength of a layer of the coating material alone.

6 Claims, 4 Drawing Sheets

U.S. PATENT DOCUMENTS

| | | | |
|---|---|---|---|
| 5,693,956 | A | 12/1997 | Shi et al. |
| 5,736,207 | A | 4/1998 | Walther et al. |
| 5,771,562 | A | 6/1998 | Harvey, III et al. |
| 5,782,355 | A | 7/1998 | Katagiri et al. |
| 5,891,554 | A | 4/1999 | Hosokawa et al. |
| 5,952,778 | A | 9/1999 | Haskal et al. |
| 5,994,174 | A | 11/1999 | Carey et al. |
| 6,040,017 | A | 3/2000 | Mikhael et al. |
| 6,066,826 | A | 5/2000 | Yializis |
| 6,083,313 | A | 7/2000 | Venkatraman et al. |
| 6,084,702 | A | 7/2000 | Byker et al. |
| 6,087,007 | A | 7/2000 | Fujii et al. |
| 6,117,266 | A | 9/2000 | Horzel et al. |
| 6,118,218 | A | 9/2000 | Yializis et al. |
| 6,146,462 | A | 11/2000 | Yializis et al. |
| 6,150,187 | A | 11/2000 | Zyung et al. |
| 6,178,082 | B1 | 1/2001 | Farooq et al. |
| 6,195,142 | B1 | 2/2001 | Gyotoko et al. |
| 6,198,217 | B1 | 3/2001 | Suzuki et al. |
| 6,198,220 | B1 | 3/2001 | Jones et al. |
| 6,207,238 | B1 | 3/2001 | Affinito |
| 6,207,239 | B1 | 3/2001 | Affinito |
| 6,217,947 | B1 | 4/2001 | Affinito |
| 6,224,948 | B1 | 5/2001 | Affinito |
| 6,228,434 | B1 | 5/2001 | Affinito |
| 6,228,436 | B1 | 5/2001 | Affinito |
| 6,268,695 | B1 | 7/2001 | Affinito |
| 6,274,204 | B1 | 8/2001 | Affinito |
| 6,333,065 | B1 | 12/2001 | Arai et al. |
| 6,348,237 | B2 | 2/2002 | Kohler et al. |
| 6,358,570 | B1 | 3/2002 | Affinito |
| 6,497,924 | B2 | 12/2002 | Affinito et al. |
| 6,570,325 | B2 | 5/2003 | Graff et al. |
| 6,962,671 | B2 | 11/2005 | Martin et al. |
| 2002/0150745 | A1* | 10/2002 | Martin et al. .................. 428/216 |
| 2005/0095422 | A1* | 5/2005 | Sager et al. .................... 428/336 |

FOREIGN PATENT DOCUMENTS

| | | |
|---|---|---|
| EP | 0 777 281 A2 | 4/1997 |
| EP | 1 278 244 A2 | 1/2003 |
| JP | 06158305 | 6/1994 |
| JP | 10312883 | 11/1998 |
| WO | 96/23217 | 8/1996 |
| WO | 00/26973 | 5/2000 |
| WO | 00/35603 | 6/2000 |
| WO | 00/35604 | 6/2000 |

OTHER PUBLICATIONS

Czeremuszkin, G., et al., "Permeation Through Defects in Transparent Barrier Coated Plastic Films", 2000 Society of Vacuum Coaters, 43rd Annual Technical Conference Proceedings, Denver, Apr. 15-20, 2000, pp. 408-413.

Henry, B.M., et al., "Microstructural and Gas Barrier Properties of Transparent Aluminum Oxide and Indium Tin Oxide Films", 2000 Society of Vacuum Coaters, 43rd Annual Technical Conference Proceedings, Denver, Apr. 15-20, 2000, pp. 373-378.

Affinito, J.D., et al., "A new method of fabricating transparent barrier layers" Thin Solid Films 290-291, 1996, pp. 63-67.

Bright, C.I., et al., "Transparent Barrier Coatings Based on ITO for Flexible Plastic Displays", Thirteenth International Conference on Vacuum Web Coating, 1999, pp. 247-255.

Yializis, A., et al., "Ultra High Barrier Films", 2000 Society of Vacuum Coaters, 43rd Annual Technical Conference Proceedings, Denver, Apr. 15-20, 2000, pp. 404-407.

* cited by examiner

NANOSTRUCTURED THIN FILM OPTICAL COATINGS

PRIORITY

This invention claims priority from provisional patent application No. 60/846,374 filed Sep. 20, 2006 entitled Optical Superlattice Coatings and Methods for Preparing and Using Same. The contents of which are herein incorporated by reference.

STATEMENT AS TO RIGHTS TO INVENTIONS MADE UNDER FEDERALLY-SPONSORED RESEARCH AND DEVELOPMENT

This invention was made with Government support under Contract No. A04-0157 awarded by the U.S. Department of Defense. The Government has certain rights in the invention.

BACKGROUND OF THE INVENTION

1. Field of the Invention

The invention generally relates to protective coverings and more particularly to thin film protective coatings for optical devices.

2. Background Information

One of the many problems associated with the design of optical materials is providing sufficient strength, hardness or durability to a particular material without negatively impacting the desired qualities or function of the underlying material. For example, transparent or translucent materials that are strengthened must be modified in a way that preserves the strength and durability to the materials without adversely affecting the desired optical characteristics of that particular item.

One of the methods for adding strength or durability to a particular device is to coat the device with a preselected material. However, one of the problems associated with typical coating arrangements is that simply thickening the coating on a particular device will, in many instances, alter desired characteristics. In addition, various other desired properties may not be achieved in single layer coatings due to excess thickness, resulting in high stress and poor microstructure. In an optical or transparent embodiment the placement of such a coating may also result in various undesired modifications or alterations to the optical or transparent properties of the device. In addition, the amount of strength that can be imparted to the material by the coating is many times limited by the inherent characteristics of the material itself. While various attempts have been made to address these problems, there still exists a need for materials and coatings that provide desired strength and durability to a portion of an optic device while allowing these optic devices to retain their desired functional properties.

SUMMARY

The present invention is a durable coating made up of superimposed microlayers of preselected materials, and a method of making and utilizing such a coating. In one embodiment of the invention, at least 200 microlayers of at least one transparent material, having a thickness of less than 50 nms are superimposed in a sequential manner so as to obtain a desired arrangement between the layers. This structure then forms a transparent coating that has strength characteristics that are substantially greater than the strength of a layer of the coating material alone. In other embodiments of the invention, more than one type of material may be utilized and the layers may be formed from alternating types of materials superimposed one upon another.

The microlayers of the present invention are formed and superimposed by a method wherein a preselected quantity of a coating material is placed upon a preselected device to form a first layer coating having a preselected thickness. Subsequent layers of preselected materials are then consecutively placed one upon the other in a preselected order and arrangement until a designated number of layers of preselected materials having a designated thickness have been superimposed one over the other. A resulting coating made up of high numbers of thin layers of a selected material is then formed. This coating provides a coating having superior strength and resistance to abrasion and does not negatively impact the desired characteristics such as the optical features of the device upon which the coating is placed.

The purpose of the foregoing abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

Various advantages and novel features of the present invention are described herein and will become further readily apparent to those skilled in this art from the following detailed description. In the preceding and following descriptions I have shown and described only the preferred embodiment of the invention, by way of illustration of the best mode contemplated for carrying out the invention. As will be realized, the invention is capable of modification in various respects without departing from the invention. Accordingly, the drawings and description of the preferred embodiment set forth hereafter are to be regarded as illustrative in nature, and not as restrictive.

DETAILED DESCRIPTION OF THE INVENTION

The following description includes the preferred best mode of an embodiment of the present invention. It will be clear from this description of the invention that the invention is not limited to these illustrated embodiments but that the invention also includes a variety of modifications and embodiments thereto. Therefore the present description should be seen as illustrative and not limiting. While the invention is susceptible of various modifications and alternative constructions, it should be understood, that there is no intention to limit the invention to the specific form disclosed, but, on the contrary, the invention is to cover all modifications, alternative constructions, and equivalents falling within the spirit and scope of the invention as defined in the claims.

Figure 1:
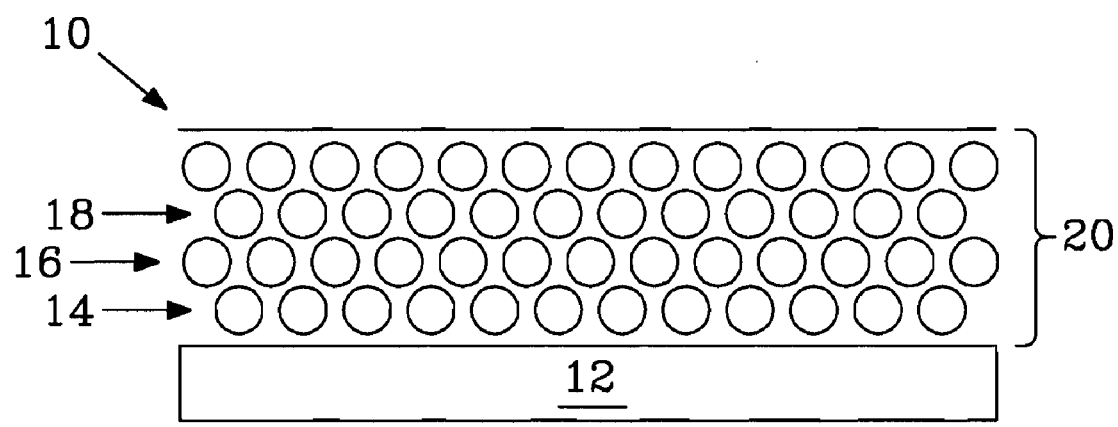
FIG. 1 is a detailed schematic view of one embodiment of the present invention.

FIGS. 1-5 show a variety of embodiments of the present invention. Referring first to FIG. 1, a detailed schematic view of one embodiment of the present invention is shown. In the embodiment shown in FIG. 1, a nanostructured thin film material 10 is shown. This material is made up of a plurality of microlayers 20 that are super positioned one upon the other. These microlayers each have a thickness of less than 50 nms, preferably in the range between 2 and 50 nms. A plurality of at least 100 and preferably more of these microlayers are then placed and overlapped in a desired orientation upon this device. In some embodiments of the invention, thousands of microlayers may be present.

In the embodiment of the invention shown in FIG. 1, the microlayers 20 are formed upon a base 12, upon which a first layer, 14, a second layer 16, a third layer 18, and so forth are consecutively superimposed. The base 12 or buffer layer performs a variety of functions including acting as a substrate for stress relief. In this embodiment of the invention at least 200 layers of these materials are superimposed to make up the plurality of microlayers 20. While these layers 20 are shown as being superimposed upon a base, it is to be distinctly understood that the base 12 is not necessarily required.

Figure 2:
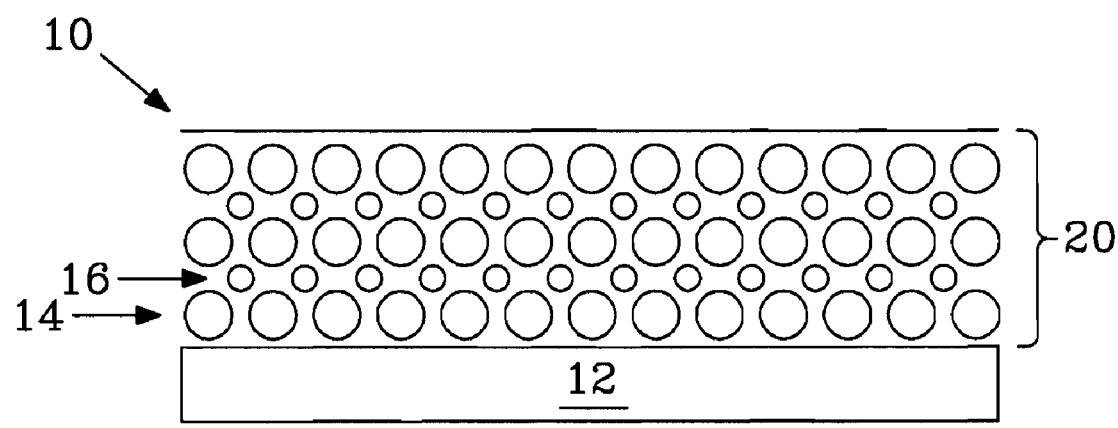
FIG. 2 is a detailed schematic view of another embodiment of the present invention.

In the embodiment of the invention shown in Fig. 2, the various layers 20, contain different materials that are arranged in an alternating pattern and superimposed to obtain a desired result. In the embodiment of the invention shown in FIG. 2 the alternating layers 20 are made up of layers of AlN and $Si_3N_4$, that are arranged in an alternating pattern of microlayers, In this embodiment of the invention there are 300 microlayers, each of these layers having a thickness of about 3 nms. The resulting coating provides a high strength optical coating that does not negatively impact the optical characteristics of the underlying device. This device is substantially better than prior art single layer coatings in as much as this device provides increased clarity, and hardness while simultaneously providing increased ease of manufacture and further flexibility and modification, While this configuration of layers is shown in this preferred best mode of the present invention, it is to be distinctly understood that the invention is not limited thereto but may be variously embodied to accommodate the particular needs and necessities of the user.

This superimposed arrangement of multiple layers 20 of a preselected material provides an arrangement referred to as a superlattice or a superlaminate. In a superlattice configuration, the materials in the layers have a preselected crystallized form and are oriented so as to take advantage of the crystallized structure and provide a more rigid coating. Examples of materials that would be included in a superlattice configuration include $ZrO_2$, $TiO_2$, $SiO_2$, $Ta_2O_5$, $Nb_2O_5$, indium tin oxide, and other similar materials. Depending upon the necessities of the user the lattice structures of the various layers may be similar or different. In a superlaminate configuration, a more amorphous configuration is preferred. In some embodiments, a polymer or plastic material is utilized as one of the materials in the coating so as to provide a more flexible configuration. Examples of materials that may be utilized include SiO, SiN, AlN, AlO and other materials. In addition to varying the materials, modification of the temperature to effect various changes in the crystalline structure may also take place. The superposition of these thin layers prevents crack propagation and also provides an increased strength that is significantly greater than single layer of the material of the same thickness.

In a superlattice embodiment of the invention, the superlattice consists of hundreds to thousands of nm-scale layers with alternating compositions and/or crystalline phases. These microlayers are appropriately stacked and offset so as to allow some degree of interfacial compressive stress to absorb the energy of the crack. Examples of desirable lattice matches are FCC/FCC and FCC/BCC. These structures work on the principles of interrupting crack propagation by periodically varying the microstructure and crystalline phase composition of the layers and improving the elastic properties by incorporating more pliant layers into a hard matrix. In such an embodiment, the embryonic crack or dislocation is terminated at the next interface between the two layers. In the preferred embodiment of the invention, the crystal lattices of the individual layers match as closely as possible, but not perfectly, as a result when a crack/dislocation begins to propagate at the surface of the coating, it is diffused by stress at the interface with the next layer. Additionally, a hard material can be combined with a more ductile material to obtain a hard material with improved ductility.

A variety of types of materials have been tested for use in the present embodiment of the invention. The following table shows various types of materials that have been applied and tested both in single as well as in superlattice/superlaminate configurations.

| Material Single Layer | Superlattice/ Superlaminate Configuration | Hardness (GPa) |
|---|---|---|
| TiAlN | | 25 |
| | TiAlN/VN | 39 |
| | TiAlNYN—VN | 78 |
| | TiAlN—CrN | 55 |
| TiN | | 15 |
| | TiCN/TiN | 25 |
| | CN/TiCN/TiN | 35 |
| | $TiN/TiC_xN_y/Si_3N_4/SiCN*$ | 55 |
| TiAlN | | 25 |
| AlN | | 18 |
| | $AlN/Si_3N_4$ | 35 |

These columns show the relative hardness of various materials both individually and when configured into a superlattice or superlaminate configuration. The coating described previously as being schematically represented in FIG. 2 having 300 alternating $AlN/Si_3N_4$ layers, each about 3 nms thick is also included on the last row in this table. These coatings were applied on zinc sulfide and fused silica optical windows. As the table demonstrates, the hardness of the optical superlattice on zinc sulfide is ~30 GPa (almost in the "ultrahard" range) and ~20 GPa on fused silica. The hardness of single layer coatings of the same thickness is in the range of 10-18 GPa.

Because the coatings in this embodiment are constructed from optically transparent materials, these coatings are extremely transparent at visible wavelengths, and are suitable in a variety of embodiments including serving as coatings on plastics, including windows, domes, windshields, mirrors and flexible webs. In addition this same or similar coating configurations can be utilized with a variety of other types of material to form coatings for non-optical devices as well.

Figure 3:
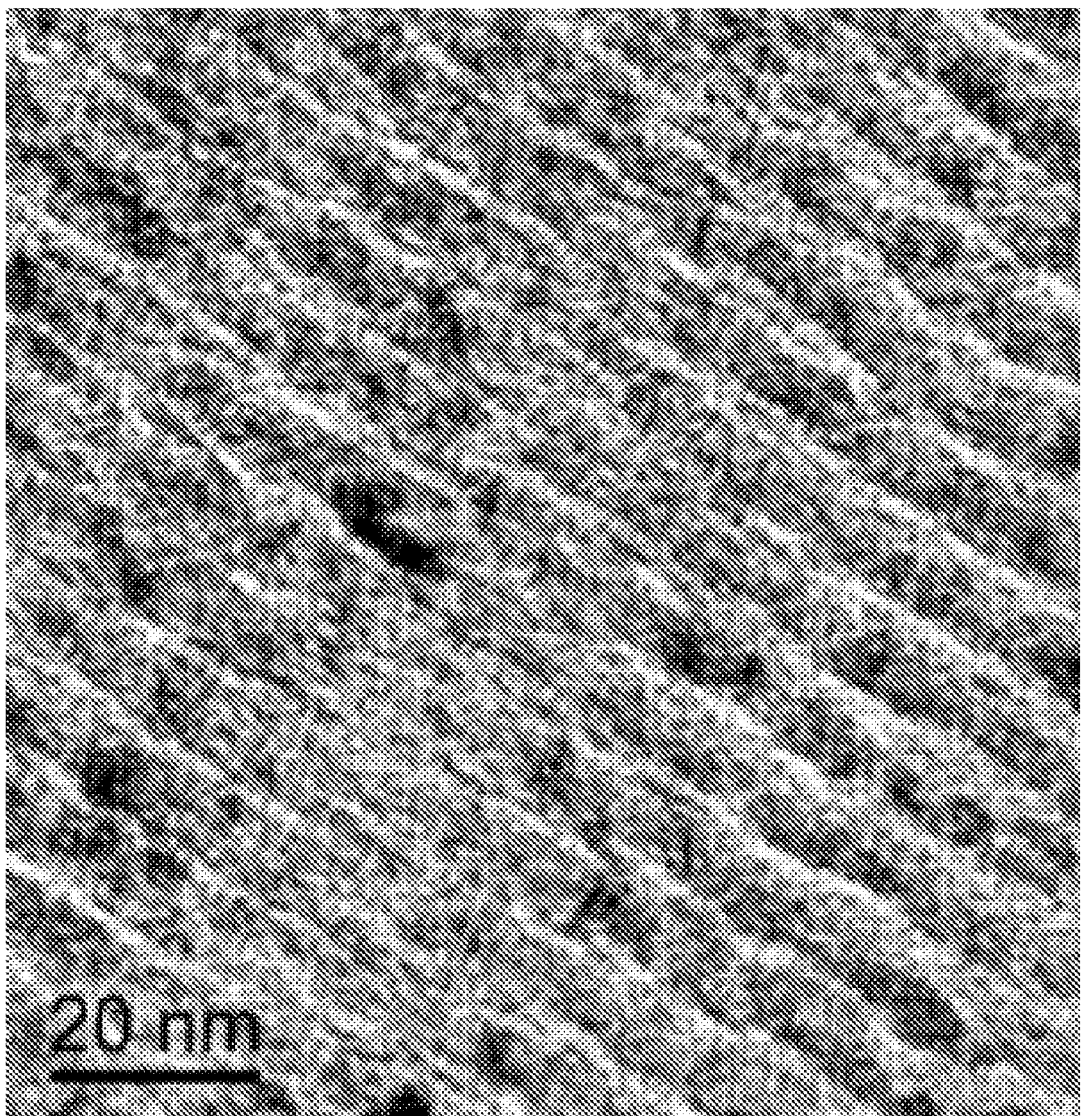
FIG. 3 is a TEM photograph of an embodiment of the present invention.

In another embodiment of the invention, a hard Cu/Al metallic and hybrid Al/acrylate polymer material were put together in a superimposed microlayer configuration. The resulting hardness of the materials increased from ~1.3 GPa for the polymer/metal structure to a hardness of about ~6 GPa for the hardness of the metallic nanolaminate. A TEM photograph of a cross section of such a coating is shown in FIG. 3. In the coating shown in FIG. 3, five thousand alternating layers of Cu having a layer thickness of 3 nm and Al having a layer thickness of 2 nm is shown are superimposed over a smooth polymer coating base in order to provide an optically smooth and specular surface. While the specific thickness of these layers have been provided, virtually any combination of microthicknesses may be utilized. Preferably the invention includes between 100 and 5000 superimposed microlayers of alternating types of transparent materials selected from the group consisting of Al, N, AlN, $Si_3N_4$, Ti, TiAlN, VN, TiAl-NYN—VN, TiAlN—Cr, TiCN, $TiC_xN_y$, $Si_3CN$, Cu, $Al_2O_3$, polymers, and combinations thereof; each of said microlayers having a thickness of less than 50 nms (preferably between 1 and 30 nms) and said optical coating having a hardness of at least 25 Gpa.

Figure 4:
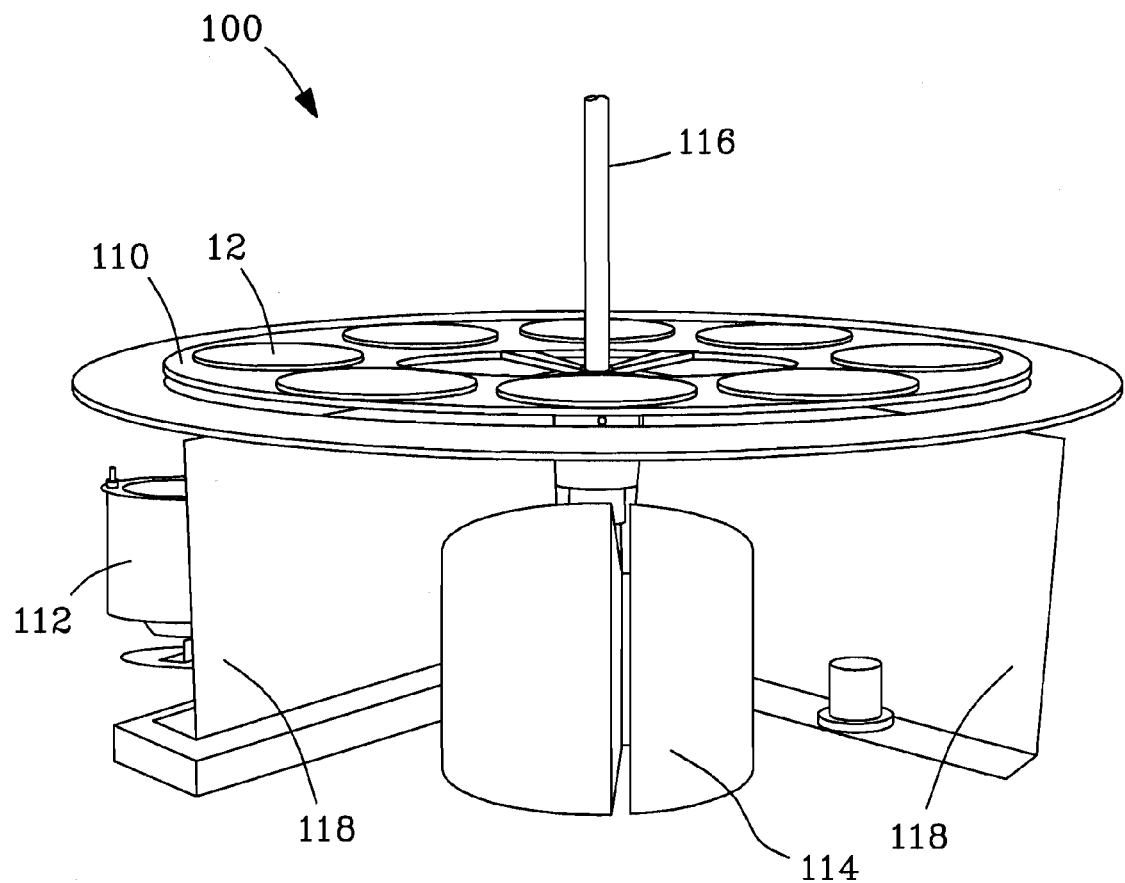
FIG. 4 is a view of a device for applying the coating of the present invention.
Figure 5:
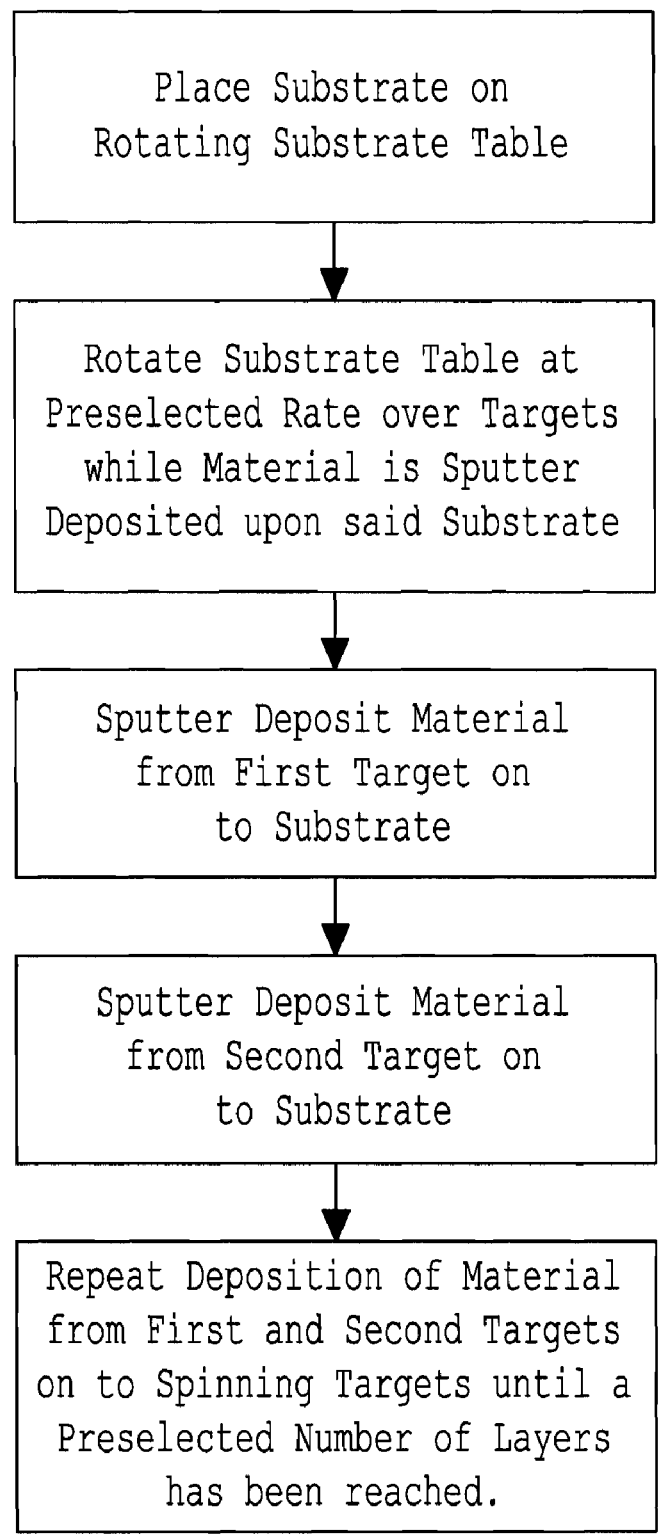
FIG. 5 is a process flow chart showing the steps for producing the device of the present invention.

The multiple superimposed layer configuration of the present invention is preferred obtained by a method whereby layers of a preselected material are sputter deposited from a target onto a substrate device. Preferably, this substrate device rotates over the targets, and the targets sputter deposit material at a preselected rate on to the target as the target rotates. Referring now to FIGS. 4 and 5, FIG. 4 shows a device for performing the deposition method, FIG. 5 shows a process flow diagram for performing the method described hereinafter.

FIG. 4 shows a device 100 having a rotating substrate table 110 that is configured to rotate about a central axis 116. This rotating substrate table 110 is adapted to hold a preselected device or substrate. In use, once a selected device or substrate has been placed upon the rotating table, the table rotates at a preselected speed over at least one and in this case at least 2 targets 112, 114 which preferably utilize a magnetron sputter deposition technique to place preselected quantities of a selected material on to the substrate or device. As the rotating substrate table continuously spins, material from the targets is sequentially applied layer over layer to produce a superimposed coating of microlayers. In some embodiments of the invention such as this, barrier devices 118 separate the targets one from the other and prevent undesired cross mixing of the materials. In addition, in some instances the atmosphere in which these sputtering techniques are utilized may be modified to include various modifications to the composition and pressure of the atmospheres in which the sputter deposition takes place. Varying the type, quantity and rate of material that is sputtered from the targets, as well as the rate at which the device spins allows for placement of material that possess a desired characteristic such as a particular refraction index or extinction coefficients to be maintained. While this device and method have been described relative to one embodiment of the invention it is to be distinctly understood that the invention is not limited thereto but may be variously configured and embodied according to the various needs and necessities of a user.

In addition to these methods, various other methods may be utilized and combined to produce desired devices. For example, the present invention allows for the even coating of curved surfaces without degradation of the optical or desired surface properties. In one embodiment of the invention, a laminate coating is deposited in the strap mode in a vacuum roll coater. This coating can then be taken off the drum and placed on a mandrel to achieve the final shape or form. The coating can also be deposited onto a flexible substrate and rolled up. By utilizing a polymer layer, the surface of the laminate mirror is extremely smooth. If desired a reflective metal such as Ag, Au or Al, or a multilayer enhanced reflector can be deposited over the laminate coating to modify the reflectance to obtain high reflectance over a specific or broad wavelength band. Once formed, various other modifications and features may be combined with the invention. For example in some configurations the polymer/metal laminate can be modified by microactuators attached to a portion of the device. No structural backing would be required for such a combination.

The present invention provides a variety of advantages including increased allowing for coatings that are very light weight, formable in a variety of applications such as a on a mandrel, or on flexible substrates, and which utilize low cost materials. These devices allow for very high deposition rates and allow both layer materials can be deposited simultaneously. Potential applications of the present invention include applications in a variety of fields.

While various preferred embodiments of the invention are shown and described, it is to be distinctly understood that this invention is not limited thereto but may be variously embodied to practice within the scope of the following claims. From the foregoing description, it will be apparent that various changes may be made without departing from the spirit and scope of the invention as defined by the following claims.

What is claimed is:

1. A durable optical coating characterized by:
    between 100 and 5000 superimposed microlayers of alternating types of transparent materials selected from the group consisting of Al, N, AlN, $Si_3N_4$, Ti, TiAlN, VN, TiAlNYN—VN, TiAlN—Cr, TiCN, $TiC_xN_y$, $Si_3CN$, Cu, $Al_2O_3$, polymers and combinations thereof; each of said microlayers having a thickness of less than 50 nms and said optical coating having a hardness of at least 25 Gpa.

2. The durable optical coating of claim 1 wherein said superimposed plurality of microlayers comprises at least 300 layers each of said layers having a thickness of less than 5 nm.

3. The durable optical coating of claim 1 wherein said superimposed plurality of microlayers form a superlaminate.

4. The durable optical coating of claim 1 wherein said superimposed plurality of microlayers form a superlattice.

5. The durable optical coating of claim 1 wherein said transparent materials include the combination of $AlN/Si_3N_4$, and a polymer.

6. A durable optical coating comprising: between about 50 and 1000 superimposed microlayers of $AlN/Si_3N_4$, each of said microlayers having a thickness between 1 and 30 nm.

* * * * *